(12) United States Patent
Chen et al.

(10) Patent No.: US 8,877,560 B2
(45) Date of Patent: Nov. 4, 2014

(54) METHOD FOR ASSEMBLING HEAT GENERATING ELEMENT AND HEAT DISSIPATING ELEMENT, PRESSURE SENSITIVE ELEMENT, AND POWER SUPPLYING UNIT

(71) Applicant: Lite-On Technology Corp., Taipei (TW)

(72) Inventors: Wen-Chi Chen, Taipei (TW); Ming-Feng Tang, Taipei (TW); Chung-Fu Wang, Taipei (TW)

(73) Assignee: Lite-On Technology Corp., Taipei (TW)

( * ) Notice: Subject to any disclaimer, the term of this patent is extended or adjusted under 35 U.S.C. 154(b) by 0 days.

(21) Appl. No.: 13/942,893

(22) Filed: Jul. 16, 2013

(65) Prior Publication Data

US 2014/0022731 A1 Jan. 23, 2014

Related U.S. Application Data

(60) Provisional application No. 61/672,332, filed on Jul. 17, 2012.

(30) Foreign Application Priority Data

Sep. 28, 2012 (CN) .......................... 2012 1 0370598

(51) Int. Cl.
  *H01L 21/00* (2006.01)
  *B32B 9/00* (2006.01)
  *B32B 33/00* (2006.01)
  *B32B 27/12* (2006.01)
  *C09J 7/02* (2006.01)
  *H05K 13/00* (2006.01)
  *H01L 23/373* (2006.01)
  *H01L 21/48* (2006.01)
  *H05K 7/20* (2006.01)
  *H01L 23/40* (2006.01)

(52) U.S. Cl.
  CPC ............... *H05K 13/00* (2013.01); *C09J 7/0207* (2013.01); *H01L 23/4006* (2013.01); *H01L 23/3737* (2013.01); *H01L 21/4882* (2013.01); *H05K 7/20* (2013.01); *C09J 7/0225* (2013.01)
  USPC .......... 438/118; 428/41.8; 428/41.9; 156/249

(58) Field of Classification Search
  USPC ......... 428/41.8, 41.9; 438/118; 361/706, 709; 156/249
  See application file for complete search history.

(56) References Cited

U.S. PATENT DOCUMENTS

2007/0257376 A1* 11/2007 Shimokawa et al. ......... 257/778
2012/0241071 A1*  9/2012 Niimi et al. ................... 156/60
2013/0148303 A1*  6/2013 Wang et al. .................. 361/705

* cited by examiner

Primary Examiner — Evan Pert
(74) Attorney, Agent, or Firm — Rosenberg, Klein & Lee

(57) ABSTRACT

A method for assembling a heat generating element and a heat dissipating element includes: preparing a pressure sensitive element including a pressure sensitive layer and first and second release films connected to the pressure sensitive layer; separating the second release film from the pressure sensitive layer and then adhering a heat dissipating element to the pressure sensitive layer; forcing the first release film; separating the first release film from the pressure sensitive layer, and then adhering a heat generating element to the pressure sensitive layer; and fixedly attaching the heat generating element onto the pressure sensitive layer. A pressure sensitive element and a power supplying unit are also disclosed.

12 Claims, 6 Drawing Sheets

| Preparing a pressure sensitive element including a pressure sensitive layer having opposite first and second connecting surfaces, a first release film connected to the first connecting surface of the pressure sensitive layer by a first connecting strength, and a second release film connected to the second connecting surface of the pressure sensitive layer by a second connecting strength, the first connecting strength being greater than the second connecting strength | ~S1 |

| Pulling the second release film away from the first release film to separate the second release film from the second connecting surface of the pressure sensitive layer to obtain an assembly of the pressure sensitive layer and the first release film, and then adhering the second connecting surface of the pressure sensitive layer of the assembly to an adhered side of a heat dissipating element | ~S2 |

| Forcing the first release film to generate a third connecting strength between the second connecting surface of the pressure sensitive layer and the adhered side of the heat dissipating element, the third connecting strength being greater than the first connecting strength | ~S3 |

| Pulling the first release film away from the adhesive layer to separate the first release film from the first connecting surface of the adhesive layer, and then adhering a heat generating element to the first connecting surface of the adhesive layer | ~S4 |

| Forcing the heat generating element to fixedly attach the heat generating element onto the first connecting surface of the adhesive layer | ~S5 |

FIG. 2

METHOD FOR ASSEMBLING HEAT GENERATING ELEMENT AND HEAT DISSIPATING ELEMENT, PRESSURE SENSITIVE ELEMENT, AND POWER SUPPLYING UNIT

CROSS-REFERENCE TO RELATED APPLICATIONS

This application claims priorities of U.S. provisional patent application No. 61/672,332, filed on Jul. 17, 2012, and China patent application no. 201210370598.4, filed on Sep. 28, 2012.

BACKGROUND OF THE INVENTION

1. Field of the Invention

The invention relates to a method for assembling a heat dissipating element and a heat generating element, more particularly to a method for assembling a heat dissipating element and a heat generating element by utilizing a pressure sensitive element. This invention also relates to the pressure sensitive element and a power supplying unit.

2. Description of the Related Art

A conventional electronic product usually needs to have a device in its design for providing power. A power supplying unit (PSU) is one kind of the power supplying devices adopted for supplying power. However, due to the intrinsic property, PSU is a heat source, and thus, there is an extra need for heat dissipating design compared to other electronic products. In the design of the PSU, numerous heat generating elements (such as heat generating diodes) are coupled to heat dissipating plates respectively for lowering the temperature thereof in order to maintain normal operation. As shown in FIG. 1, a conventional method for assembling a heat generating element 41 and a heat dissipating plate 42 is conducted by utilizing a plurality of screws 43. Another possible method to assemble the heat generating element 41 with the heat dissipating element 42 is to utilize a metal or plastic clip.

Insulation between the heat generating element 41 and the heat dissipating plate 42 needs to be considered for preventing interference to functionality of the heat generating element 41. An insulating plate 44 and an insulating washer 45 thus need to be included in the design. Such design leads to a more complicated assembling procedure and is difficult to be implemented by mechanical automation systems. Additionally, it should be noted that the torque for assembling the heat dissipating plate 42, the insulating plate 44, and the insulating washer 45 should not be too much due to their slender designs, so as to prevent breakage thereof that is caused by excessive torque and that affects property of the electronic product.

Besides, the power supplying unit (PSU) has limited inner space. The screw-nut assembly requires more space and increases difficulty in product design. Also, the heat dissipating plate 42 (made of aluminum or copper material) needs to be bored for the screws 43, and metal scraps generated while easily to fall onto other electronic components in the PSU during subsequent processing and may cause other electronic components to malfunction, thereby affecting the quality of the PSU.

Therefore, a thermosetting adhesive layer has been adopted for replacing the screws 43. A process for assembling the heat generating element and the heat dissipating plate via the thermosetting adhesive layer includes the following steps: (1) placing the thermosetting adhesive layer on the heat dissipating plate, (2) placing the heat generating element onto the thermosetting adhesive layer, (3) forcing the heat dissipating element toward the thermosetting adhesive layer to form an assembly, and most importantly, (4) heating the assembly continuously in a heating furnace under a high temperature environment (above 120° C.) for minutes to cause adhesion function of the thermosetting adhesive layer by heat. However, this method requires thermosetting procedure in the heating furnace at a high temperature, and thus facility cost (such as purchasing the high temperature chamber and energy consumption) and production time (heating in the furnace with temperature control increases the difficulty of the mechanical automation) would be increased, thereby lowering the manufacturing efficiency.

SUMMARY OF THE INVENTION

Therefore, the object of the present invention is to provide a convenient method for assembling a heat generating element and a heat dissipating element to increase product property and production efficiency, and to provide a pressure sensitive element and a power supplying unit.

According to one aspect of this invention, a method for assembling a heat generating element and a heat dissipating element includes the following steps of:

(a) preparing a pressure sensitive element including:
 a pressure sensitive layer having opposite first and second connecting surfaces,
 a first release film connected to the first connecting surface of the pressure sensitive layer by a first connecting strength, and
 a second release film connected to the second connecting surface of the pressure sensitive layer by a second connecting strength, the first connecting strength being greater than the second connecting strength;

(b) pulling the second release film away from the first release film to separate the second release film from the second connecting surface of the pressure sensitive layer to obtain an assembly of the pressure sensitive layer and the first release film, and then adhering the second connecting surface of the pressure sensitive layer of the assembly to an adhered side of a heat dissipating element;

(c) forcing the first release film to generate a third connecting strength between the second connecting surface of the pressure sensitive layer and the adhered side of the heat dissipating element, the third connecting strength being greater than the first connecting strength;

(d) pulling the first release film away from the pressure sensitive layer to separate the first release film from the first connecting surface of the pressure sensitive layer, and then adhering a heat generating element to the first connecting surface of the pressure sensitive layer; and (e) forcing the heat generating element to fixedly attach the heat generating element onto the first connecting surface of the pressure sensitive layer.

According to another aspect of this invention, a pressure sensitive element includes:

a pressure sensitive layer having opposite first and second connecting surfaces;

a first release film that is connected to the first connecting surface of the pressure sensitive layer by a first connecting strength; and a second release film that is connected to the second connecting surface of the pressure sensitive layer by a second connecting strength, the first connecting strength being greater than the second connecting strength.

According to yet another aspect of this invention, a power supplying unit includes:

at least one heat dissipating element having an adhered side;

a pressure sensitive layer having opposite first and second connecting surfaces, the second connecting surface being in contact with the adhered side of the heat dissipating element; and at least one heat generating element that is fixedly attached to the first connecting surface of the pressure sensitive layer.

BRIEF DESCRIPTION OF THE DRAWINGS

Other features and advantages of the present invention will become apparent in the following detailed description of the preferred embodiment with reference to the accompanying drawings, of which:

FIG. 2 is a flow chart of a method of the preferred embodiment according to the present invention for assembling a heat generating element and a heat dissipating element;

DETAILED DESCRIPTION OF THE PREFERRED EMBODIMENT

Figure 1:
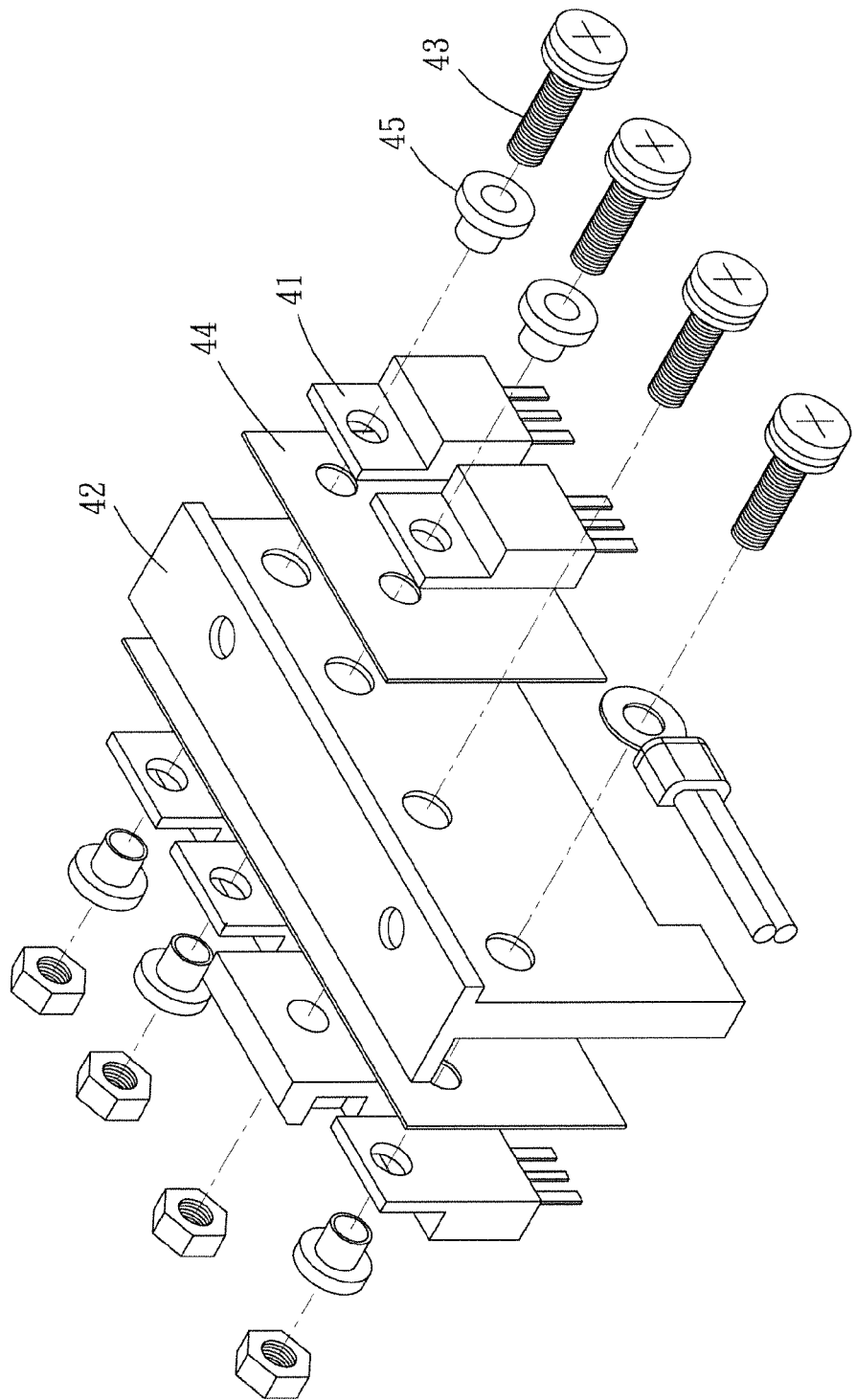
FIG. 1 is an exploded view of a conventional screw-nut assembly for assembling heat generating elements and a heat dissipating plate.

Before the present invention is described in greater detail, it should be noted that like elements are denoted by the same reference numerals throughout the disclosure.

Figure 5:
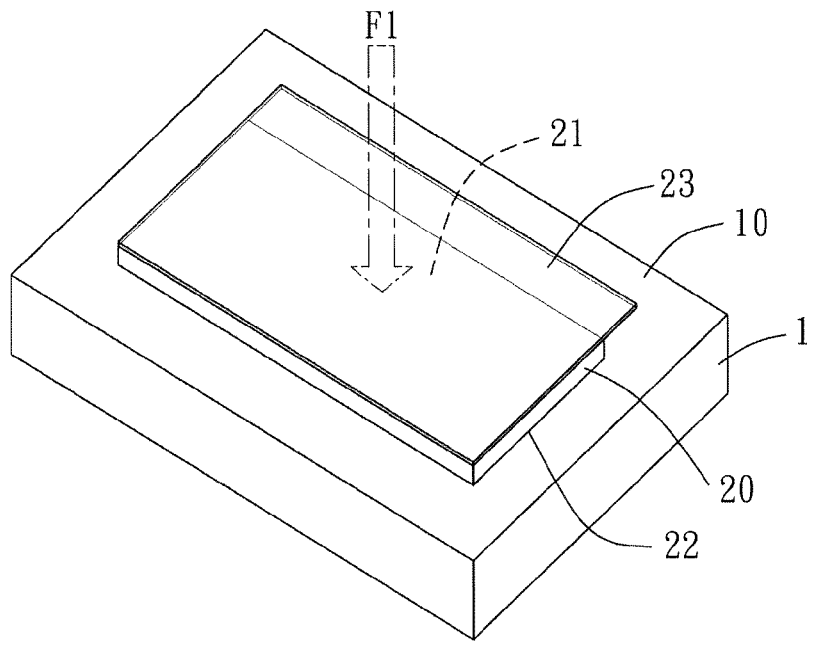
FIG. 5 is a perspective view illustrating that the pressure sensitive layer is forced to adhere on the heat dissipating element.

Referring to FIGS. 2 to 7, a method for assembling a heat dissipating element 1 (called heat sink hereinafter) and heat generating elements 31 and 32 of the preferred embodiment according to the present invention is disclosed. As shown in FIG. 5, the heat sink 1 has an adhered side 10. As shown in FIG. 2, step S1 is to prepare a pressure sensitive element 2 (see FIG. 3). The pressure sensitive element 2 includes a pressure sensitive layer 20 having opposite first and second connecting surfaces 21 and 22, a first release film 23 connected to the first connecting surface 21 of the pressure sensitive layer 20, and a second release film 24 connected to the second connecting surface 22 of the pressure sensitive layer 20. The first and second connecting surfaces 21 and 22 are adhesive, and the first and second release films 23, 24 have different releasing strengths, such that a first connecting strength between the first release film 23 and the first connecting surface 21 is greater than a second connecting strength between the second release film 24 and the second connecting surface 22. The pressure sensitive layer 20 is made of a material, preferably a silicone-based material, which is thermal-resistant, electrically insulating, heat conductive, and impact resistant, such as Li-2000A form T-Global Technology Co., or TC-20SAS from ShinEtsu Chemical Co., Ltd. Preferably, thickness of the pressure sensitive layer 20 ranges from 0.15 mm to 0.3 mm. Preferably, the first connecting strength is about three times larger than the second connecting strength. For example, when the first connecting strength is 30 gw/cm$^2$, the second connecting strength is 10 gw/cm$^2$.

Figure 3:
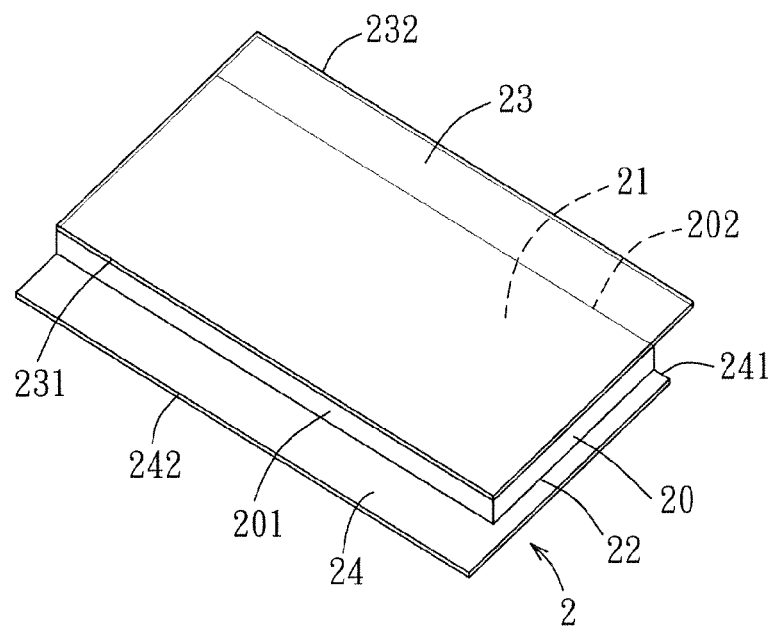
FIG. 3 is a perspective view of a pressure sensitive element of the preferred embodiment according to the present invention.
Figure 4:
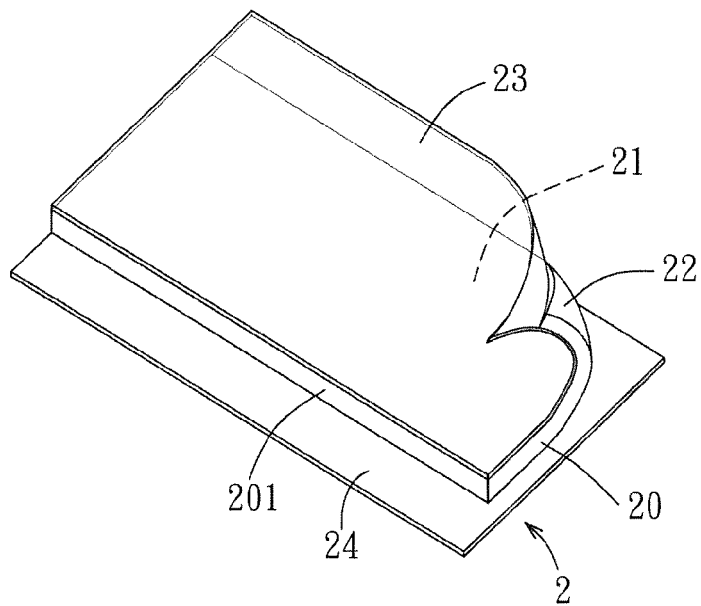
FIG. 4 is a perspective view illustrating that a second release film of the pressure sensitive element is pulled to be separated from a pressure sensitive layer of the pressure sensitive element.

It should be noted that widths of the first and second release films 23 and 24 are wider than that of the pressure sensitive layer 20 for separation convenience. As shown in FIG. 3, the pressure sensitive layer 20 has a first edge 201 and a second edge 202 cooperating with the first edge 201 to define the width thereof, the first release film 23 has a third edge 231 and a fourth edge 232 cooperating with the third edge 231 to define the width thereof, and the second release film 24 has a fifth edge 241 and a sixth edge 242 cooperating with the fifth edge 241 to define the width thereof. The third edge 231 of the first release film 23 is aligned with the first edge 201 of the pressure sensitive layer 20 in a top-bottom direction, and the fifth edge 241 of the second release film 24 is aligned with the second edge 202 of the pressure sensitive layer 20 in the top-bottom direction. The second edge 202 is disposed between the fourth edge 232 and the third edge 231, and is spaced from the fourth edge 232 by a distance of at least 4 mm. The first edge 201 is disposed between the sixth edge 242 and the fifth edge 241 and is spaced from the sixth edge 242 by a distance of at least 4 mm. Although in this embodiment, the first and second release films 23 and 24 extend respectively and outwardly from the opposite first and second edges 201 and 202 of the pressure sensitive layer 20, the first and second release films 23 and 24 may extend outwardly from the same edge of the pressure sensitive layer 20, so that the present invention is not limited in this regard.

Subsequently, in step S2 of the method, the second release film 24 is pulled away from the first release film 23. Since the first connecting strength between the first release film 23 and the first connecting surface 21 is greater than the second connecting strength between the second release film 24 and the second connecting surface 22, in this step, the first connecting surface 21 of the pressure sensitive layer 20 remains adhered to the first release film 23 while the second release film 24 is separated from the second connecting surface 22 of the pressure sensitive layer 20 (see FIG. 4). When the second release film 24 is completely torn away from the second connecting surface 22 of the pressure sensitive layer 20, an assembly containing the pressure sensitive layer 20 and the first releasing film 23 is obtained. The second connecting surface 22 of the pressure sensitive layer 20 is adhered to the adhered side 10 of the heat sink 1.

In order to securely attach the assembly onto the heat sink 1, step S3 is conducted. As shown in FIG. 5, the first release film 23 of the assembly is pressed with a first pressing force F1 (about 4 to 6 kgw) by, for example, a roller to fixedly attach the second connecting surface 22 of the pressure sensitive layer 20 of the assembly to the adhered side 10 of the heat sink 1 and to generate a third connecting strength, which is greater than the first connecting strength, between the second connecting surface 22 of the pressure sensitive layer 20 and the adhered side 10 of the heat sink 1.

Figure 6:
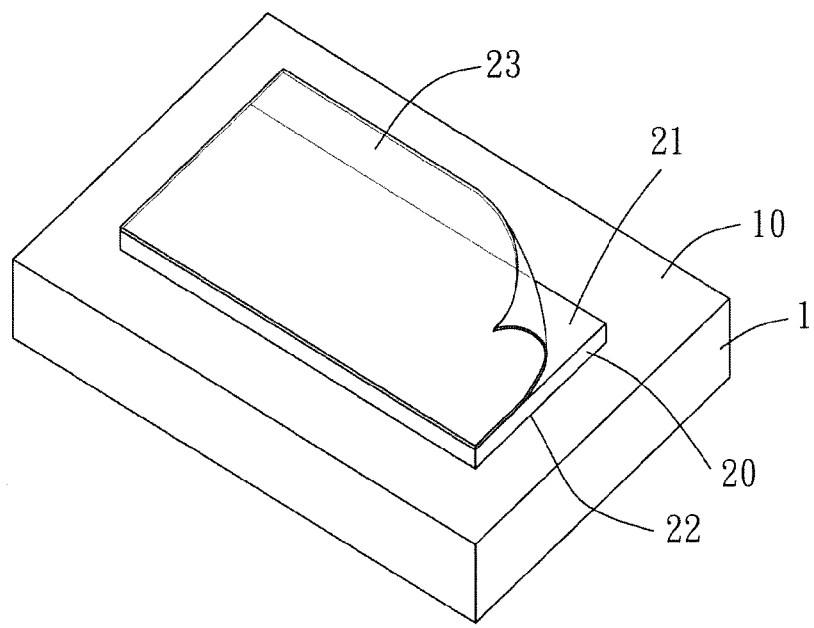
FIG. 6 is a perspective view illustrating that a first release film is pulled to be separated from the pressure sensitive layer of the pressure sensitive element.
Figure 7:
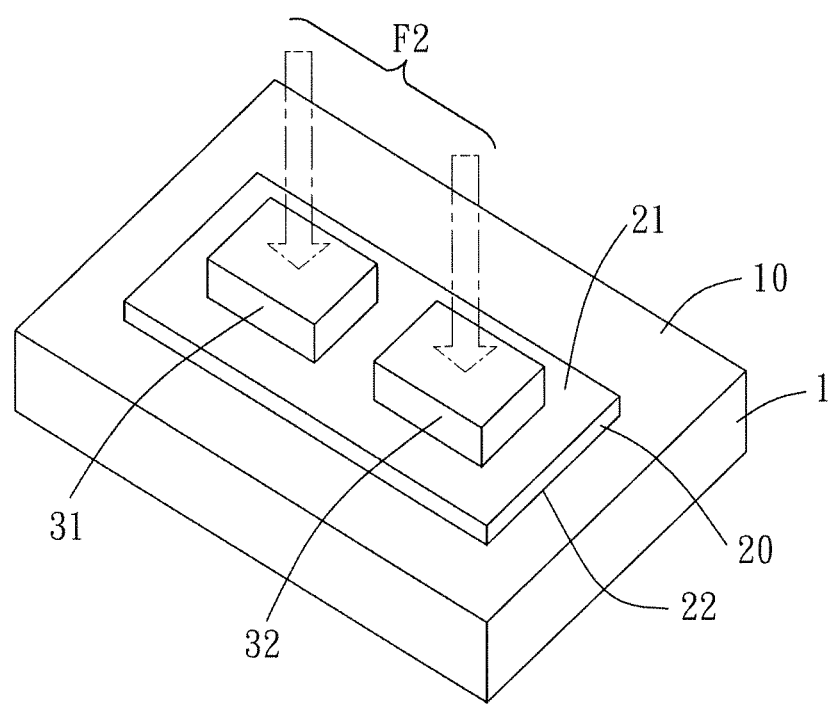
FIG. 7 is a perspective view illustrating that heat generating elements are placed and fixedly attached on the pressure sensitive layer.

Next, step S4 is conducted. As shown in FIG. 6, the first release film 23 is pulled away from the pressure sensitive layer 20 and is separated from the first connecting surface 21 of the pressure sensitive layer 20. As shown in FIG. 7, two heat generating elements 31 and 32 are then adhered to the first connecting surface 21 of the pressure sensitive layer 20.

It should be noted that, while two heat generating elements 31 and 32 are exemplified herein, the number of the heat generating elements on the pressure sensitive layer 20 should not be limited to the disclosure in this embodiment and may vary based on the area of the pressure sensitive layer 20, the sizes of the heat generating elements, or actual requirements.

Then, in step S5, the heat generating elements 31 and 32 are evenly pressed by a second pressing force F2 so as to fixedly attach the heat generating elements 31 and 32 onto the first connecting surface 21 of the pressure sensitive layer 20. In this embodiment, the second pressing force F2 is 20 psi and is applied to the heat generating elements 31 and 32 for at least 10 seconds.

It is worth to mention that the heat sink 1 and the heat generating elements 31 and 32 are components contained in a power supplying unit, and the method of this embodiment utilizes the pressure sensitive layer 20 to fixedly combine the heat generating elements 31 and 32 with the heat sink 1, so that heat generated from the heat generating elements 31 and 32 during operation can be dissipated by the heat sink 1, thereby lowering the temperature of the heat generating elements 31 and 32. In this embodiment, the heat generating elements 31 and 32 are power transistors or diodes in a power factor corrector (PFC), a rectifier circuit such as a full bridge rectifier or a half bridge rectifier, a step-up converter circuit, a step-down converter circuit or other circuits contained in a power supplying unit.

Further, conventional adhesives are usually doped with carriers such as glass fibers or Kapton (a polyimide film developed by DuPont Co.) to increase electrical insulating property but simultaneously sacrificing heat conductivity thereof attributed to increased thermal resistance. However, the pressure sensitive layer 20 of this embodiment (0.15 mm to 0.3 mm) is thick enough to provide sufficient electrical insulating property, so that such carriers can be excluded therefrom. Thus, the pressure sensitive layer 20 has low thermal resistance and the thermal conductivity thereof is improved. After the heat generating elements 31 and 32, and the heat sink 1 are assembled using the method of this invention, the object of fixedly combining the heat generating elements 31 and 32, and the heat sink 1 can be achieved. Moreover, by virtue of the sufficient electrical insulation property and thermal conductivity of the pressure sensitive layer 20, the method of this invention can be used to replace the conventional screw-nut assembly.

Figure 8:
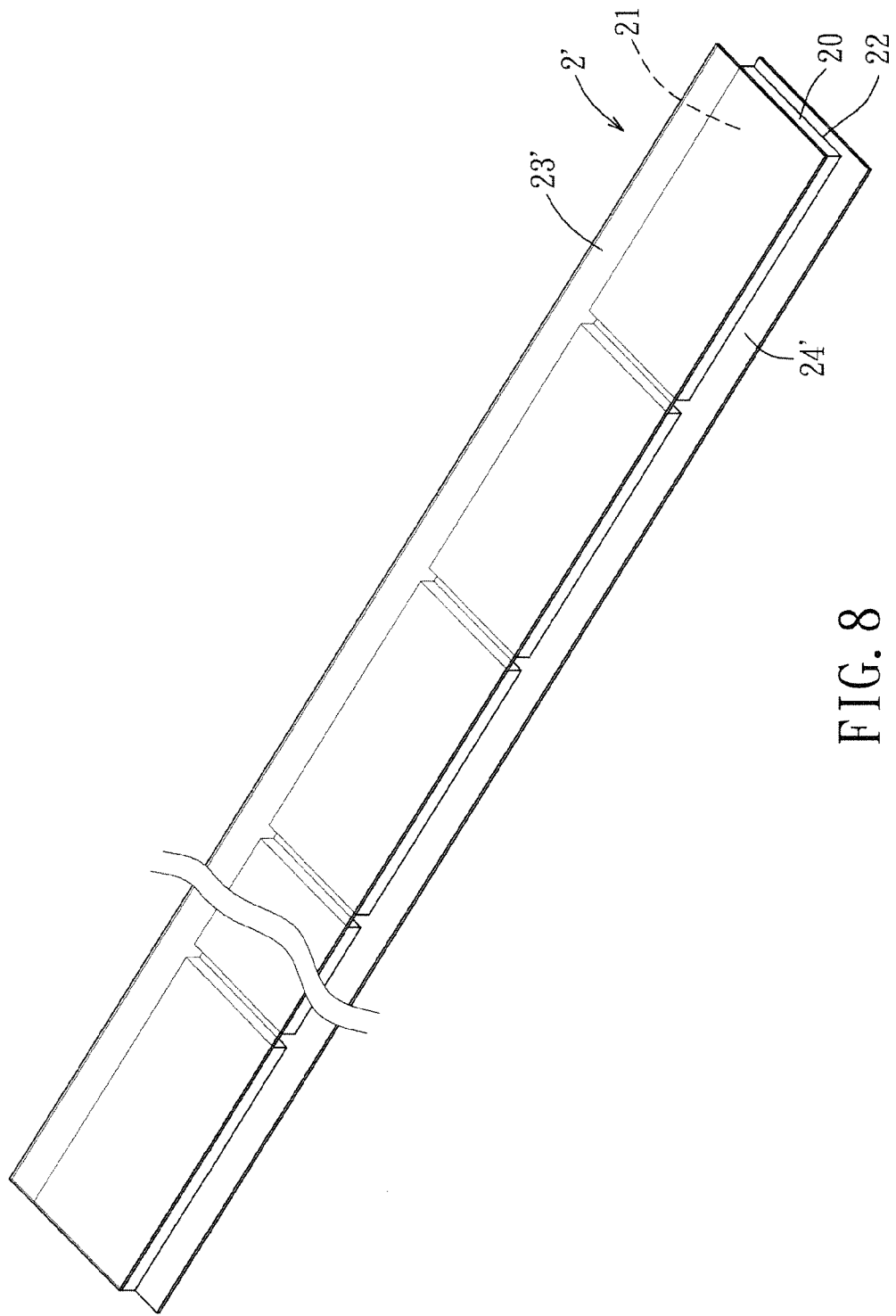
FIG. 8 is a fragmentary perspective view of a modification of the pressure sensitive element according to the present invention.

In addition, for the sake of convenience, the pressure sensitive element can be manufactured as a belt shape of the pressure sensitive element 2' (see FIG. 8, also can be rolled into a roll shape), which includes a plurality of spaced-apart pressure sensitive layers 20, and first and second belt-like release films 23' and 24' attached to the first and second connecting surfaces 21 and 22 of the pressure sensitive layers 20. Designs for the first and second belt-like release films 23' and 24' are similar to those of the first and second release films 23 and 24.

To sum up, with the pressure sensitive layer 20 and the first and second release films 23, 23', 24 and 24' respectively connected to the first and second connecting surfaces 21 and 22, and with the first connecting strength between the first release film 23 and the pressure sensitive layer 20 larger than the second connecting strength between the second release film 24 and the pressure sensitive layer 20, the second release film 24 can be easily torn away from the pressure sensitive layer 20. After the second connecting surface 22 of the pressure sensitive layer 20 is adhered to the heat sink 1, the pressure sensitive layer 20 is forced to the heat sink 1 so as to generate the third connecting strength, which is larger than the first connecting strength, between the pressure sensitive layer 20 and the heat sink 1. Next, the first release film 23 is torn away from the pressure sensitive layer 20, followed by attaching and forcing the heat generating elements 31 and 32 onto the first connecting surface 21 of the pressure sensitive layer 20 to fixedly assemble the heat generating elements 31 and 32 with the heat sink 1.

By the method of this invention, there is no need to adopt the screw-nut assembly to assemble the heat generating elements 31 and 32, and the heat sink 1, thereby saving the interior space of the power supplying unit, as well as preventing the metal scraps generated while boring from falling onto other electronic components in the PSU to eliminate malfunction of electronic components attributed to the metal scraps. Also, in the method of this invention, connections between the heat generating elements 31 and 32 and the heat sink 1 are conducted by applying pressing forces, and there is no need to provide manual operations for locking the screws, so that a mechanical automation system can be introduced in the method of this invention to save labor costs. Furthermore, since the connection of the heat generating elements 31 and 32 and the heat sink 1 in the method of the present invention is conducted using the pressing forces without a heating process in a high temperature chamber, manufacturing time and costs could be reduced, thereby improving production efficiency and quality.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method for assembling a heat generating element and a heat dissipating element, comprising the following steps of:
   (a) preparing a pressure sensitive element including:
      a pressure sensitive layer having opposite first and second connecting surfaces,
      a first release film connected to the first connecting surface of the pressure sensitive layer by a first connecting strength, and
      a second release film connected to the second connecting surface of the pressure sensitive layer by a second connecting strength, the first connecting strength being greater than the second connecting strength;
   (b) pulling the second release film away from the first release film to separate the second release film from the second connecting surface of the pressure sensitive layer to obtain an assembly of the pressure sensitive layer and the first release film, and then adhering the second connecting surface of the pressure sensitive layer of the assembly to an adhered side of a heat dissipating element;
   (c) forcing the first release film to generate a third connecting strength between the second connecting surface of the pressure sensitive layer and the adhered side of the heat dissipating element, the third connecting strength being greater than the first connecting strength;
   (d) pulling the first release film away from the pressure sensitive layer to separate the first release film from the first connecting surface of the pressure sensitive layer, and then adhering a heat generating element to the first connecting surface of the pressure sensitive layer; and
   (e) forcing the heat generating element to fixedly attach the heat generating element onto the first connecting surface of the pressure sensitive layer.

2. The method as claimed in claim 1, wherein step (e) is conducted at 20 psi for at least 10 seconds.

3. The method as claimed in claim 1, wherein the pressure sensitive layer has a thickness ranging from 0.15 mm to 0.3 mm.

4. The method as claimed in claim 1, wherein the first connecting strength is three times the second connecting strength.

5. The method as claimed in claim 1, wherein the first release film, the second release film, and the pressure sensitive layer have widths, the widths of the first release film and the second release film being larger than that of the pressure sensitive layer.

6. The method as claimed in claim 5, wherein:
the pressure sensitive layer has a first edge and a second edge cooperating with the first edge to define the width of the pressure sensitive layer;
the first release film has a third edge, and a fourth edge cooperating with the third edge to define the width of the first release film;
the second release film has a fifth edge and a sixth edge cooperating with the fifth edge to define the width of the second release film;
the third edge is aligned with the first edge in a top-bottom direction, and the fifth edge is aligned with the second edge in the top-bottom direction;
the second edge is disposed between the fourth edge and the third edge, and is spaced from the fourth edge by a distance of at least 4 mm; and
the first edge is disposed between the sixth edge and the fifth edge, and is spaced from the sixth edge by a distance of at least 4 mm.

7. The method as claimed in claim 1, wherein the heat generating element is a power transistor or a diode.

8. The method as claimed in claim 1, wherein the pressure sensitive layer is made of a silicone-based material that is thermal-resistant, electrically insulating, heat conductive, and impact resistant, the first connecting surface and the second connecting surface of the pressure sensitive layer being adhesive.

9. A pressure sensitive element comprising:
a pressure sensitive layer having opposite first and second connecting surfaces;
a first release film that is connected to said first connecting surface of said pressure sensitive layer by a first connecting strength; and
a second release film that is connected to said second connecting surface of said pressure sensitive layer by a second connecting strength, said first connecting strength being greater than said second connecting strength;
wherein said first release film, said second release film, and said pressure sensitive layer have respective widths, the widths of said first release film and said second release film being larger than the width of said pressure sensitive layer.

10. The pressure sensitive element as claimed in claim 9, wherein said pressure sensitive layer has a thickness ranging from 0.15 mm to 0.3 mm.

11. The pressure sensitive element as claimed in claim 9, wherein said pressure sensitive layer is made of a silicone-based material that is thermal-resistant, electrically insulating, heat conductive, and impact resistant, the first connecting surface and the second connecting surface of the pressure sensitive layer being adhesive.

12. The pressure sensitive element as claimed in claim 9, wherein:
said pressure sensitive layer has a first edge and a second edge cooperating with said first edge to define the width of said pressure sensitive layer;
said first release film has a third edge, and a fourth edge cooperating with said third edge to define the width of said first release film;
said second release film has a fifth edge and a sixth edge cooperating with said fifth edge to define the width of said second release film;
said third edge of said first release film is aligned with said first edge of said pressure sensitive layer in a top-bottom direction, and said fifth edge of said second release film is aligned with said second edge of said pressure sensitive layer in the top-bottom direction;
said second edge of said pressure sensitive layer is disposed between said fourth edge and said third edge of said first release film, and is spaced from said fourth edge by a distance of at least 4 mm; and
said first edge of said second release film is disposed between said sixth edge and said fifth edge of said pressure sensitive layer, and is spaced from said sixth edge by a distance of at least 4 mm.

* * * * *